United States Patent [19]
Ando

[11] Patent Number: 6,021,502
[45] Date of Patent: Feb. 1, 2000

[54] SYSTEM FOR MONITORING POWER CONSUMPTION OF SEMICONDUCTOR DEVICES

[75] Inventor: Hideki Ando, Tokyo, Japan

[73] Assignee: Mitsubishi Denki Kabushiki Kaisha, Tokyo, Japan

[21] Appl. No.: 08/873,768

[22] Filed: Jun. 12, 1997

[30] Foreign Application Priority Data

Mar. 19, 1997 [JP] Japan .................................... 9-066359

[51] Int. Cl.[7] .................................................. G06F 1/46
[52] U.S. Cl. ............................................ 713/340; 713/300
[58] Field of Search ........................ 395/750.08, 750.03; 711/105, 166

[56] References Cited

U.S. PATENT DOCUMENTS

| | | | |
|---|---|---|---|
| 4,551,841 | 11/1985 | Fujita et al. ................................ | 371/66 |
| 5,261,082 | 11/1993 | Ito et al. .................................... | 395/550 |
| 5,357,193 | 10/1994 | Tanaka et al. ........................... | 324/158.1 |
| 5,404,543 | 4/1995 | Faucher et al. ........................... | 395/750 |
| 5,432,944 | 7/1995 | Nuckolls et al. ......................... | 395/750 |
| 5,452,277 | 9/1995 | Bajorek et al. ........................... | 369/54 |
| 5,483,656 | 1/1996 | Oprescu et al. .......................... | 395/750 |
| 5,515,302 | 5/1996 | Horr et al. ................................ | 364/578 |
| 5,532,935 | 7/1996 | Ninomiya et al. ....................... | 364/492 |
| 5,694,607 | 9/1996 | Dunstan et al. .......................... | 395/750 |
| 5,771,345 | 6/1998 | Tallman et al. ..................... | 395/183.06 |

FOREIGN PATENT DOCUMENTS

| | | |
|---|---|---|
| 1-292416 | 11/1989 | Japan . |
| 5-100777 | 4/1993 | Japan . |
| 6-282984 | 10/1994 | Japan . |
| 8-76875 | 3/1996 | Japan . |

OTHER PUBLICATIONS

Reference L–O cited by applicant, Sep. 14, 1998.

*Primary Examiner*—Ayaz R. Sheikh
*Assistant Examiner*—Theresa L. Davis
*Attorney, Agent, or Firm*—Burns, Doane, Swecker & Mathis, LLP

[57] ABSTRACT

A technique for providing information about the relationship between circuits and the amounts of power consumed by the respective circuits to control a heat-sensitive circuit with higher accuracy is disclosed. A decoder (6a) causes an ALU power evaluation counter (7a) to count when a control code applied thereto is not an ALU control code. The ALU power evaluation counter (7a) counts the number of control codes which do not operate an ALU (5a). A multiplier (14) multiplies the output from the ALU power evaluation counter (7a) by a predetermined number to provide the result to an adder (10). The adder (10) adds the results from multipliers (14–16) together to store the result in a total power evaluation register (11). The smaller the value stored in the total power evaluation register (11), the greater the amount of heat generated. A DRAM refresh control circuit (12) shortens a refresh cycle so that a DRAM (13) is frequently refreshed.

2 Claims, 5 Drawing Sheets

SYSTEM FOR MONITORING POWER CONSUMPTION OF SEMICONDUCTOR DEVICES

BACKGROUND OF THE INVENTION

1. Field of the Invention

The present invention relates to a semiconductor device for collecting information about power consumption and controlled to operate on the basis of the information.

2. Description of the Background Art

Semiconductor devices generate heat in accordance with the amount of power consumption. The performance of some circuits is significantly influenced by heat. Such circuits have been designed on the basis of the assumed maximum amount of heat dissipated from the entire device. An example of circuits sensitive to heat includes a DRAM which holds memory contents for a shorter period of time with increasing temperatures and which accordingly must be frequently refreshed with a shorter refresh cycle. Therefore, when the DRAM and another semiconductor device are designed to be integrated together, the maximum amount of heat dissipated from the device must be assumed for determination of the DRAM refresh cycle.

Such assumption is provided for the worst case. Under practical use, the worst situation does not always occur. Then, the above described determination of the refresh cycle is pessimistic (i.e., results in higher levels of specifications than necessary, referred to hereinafter as overspecs). For example, since the DRAM is not permitted to access data and all sense amplifiers operate in unison during a refresh time period, such overspecs unnecessarily deteriorate the performance and lead to unnecessary amounts of power consumption.

One of the common approaches for reducing power consumption is to supply a minimum needed amount of power when no operations are required. This approach may be implemented via software. In a computer, for example, when no programs are currently being executed (in an idle state) and no inputs are entered from a keyboard and a mouse for a given period of time, the operating system of the computer judges that there is no need to subsequently operate for some time to decrease the clock rate of a CPU or the brightness of a monitor.

The above described approach may be readily implemented but is disadvantageous in that all elements of the semiconductor device must be placed into normal operation if only some of the elements are required to operate or permitted to stop. That is, the entire semiconductor device must be idle, failing to minimize power consumption.

SUMMARY OF THE INVENTION

According to a first aspect of the present invention, a semiconductor device comprises: a plurality of first circuits; an individual power evaluation portion for individually estimating the respective amounts of power consumed by the plurality of first circuits; and a total power evaluation portion for determining the sum of the amounts of power consumed by all of the plurality of first circuits on the basis of a result from the individual power evaluation portion.

Preferably, according to a second aspect of the present invention, in the semiconductor device of the first aspect, the individual power evaluation portion comprises first counters provided in corresponding relation to the plurality of first circuits, each of the first counters for counting on the basis of whether or not a corresponding one of the plurality of first circuits operates.

Preferably, according to a third aspect of the present invention, in the semiconductor device of the second aspect, the individual power evaluation portion further comprises multipliers provided in corresponding relation to the plurality of first circuits, each of the multipliers for multiplying an output from a corresponding one of the first counters by a value inherent in a corresponding one of the plurality of first circuits.

Preferably, according to a fourth aspect of the present invention, in the semiconductor device of the second aspect, each of the first counters comprises an adder for adding up a value inherent in a corresponding one of the plurality of first circuits on the basis of whether or not the plurality of first circuits operate.

Preferably, according to a fifth aspect of the present invention, the semiconductor device of the second aspect further comprises a first control portion for controlling the operation of a second circuit on the basis of a result from the total power evaluation portion, the second circuit differing from the plurality of first circuits.

Preferably, according to a sixth aspect of the present invention, the semiconductor device of the first aspect further comprises a power switch provided in corresponding relation to one of the plurality of first circuits for controlling power to be supplied to the one circuit on the basis of the result from the individual power evaluation portion.

Preferably, according to a seventh aspect of the present invention, the semiconductor device of the sixth aspect further comprises a power switch control portion for controlling a conducting/nonconducting state of the power switch to output a wait instruction, the wait instruction being active for a predetermined period of time after the power switch is brought into conduction.

Preferably, according to an eighth aspect of the present invention, in the semiconductor device of the sixth aspect, the individual power evaluation portion comprises counters provided in corresponding relation to the plurality of first circuits, each of the counters for counting on the basis of whether or not a corresponding one of the plurality of first circuits operates.

In accordance with the semiconductor device of the first aspect of the present invention, the amounts of power consumed by the plurality of first circuits may be individually estimated. Thus, the amount of power consumption is accurately provided.

In accordance with the semiconductor device of the second aspect of the present invention, the first counters individually count the presence/absence of the operation of the first circuits. Thus, the amounts of power consumed by the plurality of first circuits may be individually estimated.

In accordance with the semiconductor device of the third aspect of the present invention, the magnitude of power consumption by the operation of each of the plurality of first circuits may be correctly estimated.

In accordance with the semiconductor device of the fourth aspect of the present invention, the magnitudes of power consumption per operation which differ from each other depending on the plurality of first circuits may be correctly estimated without the use of a multiplier.

In accordance with the semiconductor device of the fifth aspect of the present invention, the refresh operation of the DRAM is controlled on the basis of the accurately provided amount of power consumption. Therefore, the refresh operation of the DRAM may be accurately controlled against the adverse effect of heat resulting from power consumed by the plurality of first circuits upon the refresh operation of the DRAM.

In accordance with the semiconductor device of the sixth aspect of the present invention, control of power supply to a particular one of the plurality of first circuits which is used less frequently achieves suppression of power consumption.

In accordance with the semiconductor device of the seventh aspect of the present invention, an operating instruction for the circuit which operates unstably during transition after the start of power supply may be placed into a wait state. This avoids malfunctions.

In accordance with the semiconductor device of the eighth aspect of the present invention, the counters individually count the presence/absence of the operation of the first circuits. Whether the frequency of the use of each of the plurality of first circuits is high or low may be estimated.

It is therefore an object of the present invention to provide a technique for providing detailed information about the amount of power consumption or about the relationship between circuits and the amounts of power consumed by the respective circuits to control a heat-sensitive circuit with higher accuracy.

These and other objects, features, aspects and advantages of the present invention will become more apparent from the following detailed description of the present invention when taken in conjunction with the accompanying drawings.

DESCRIPTION OF THE PREFERRED EMBODIMENTS

First Preferred Embodiment

Figure 1:
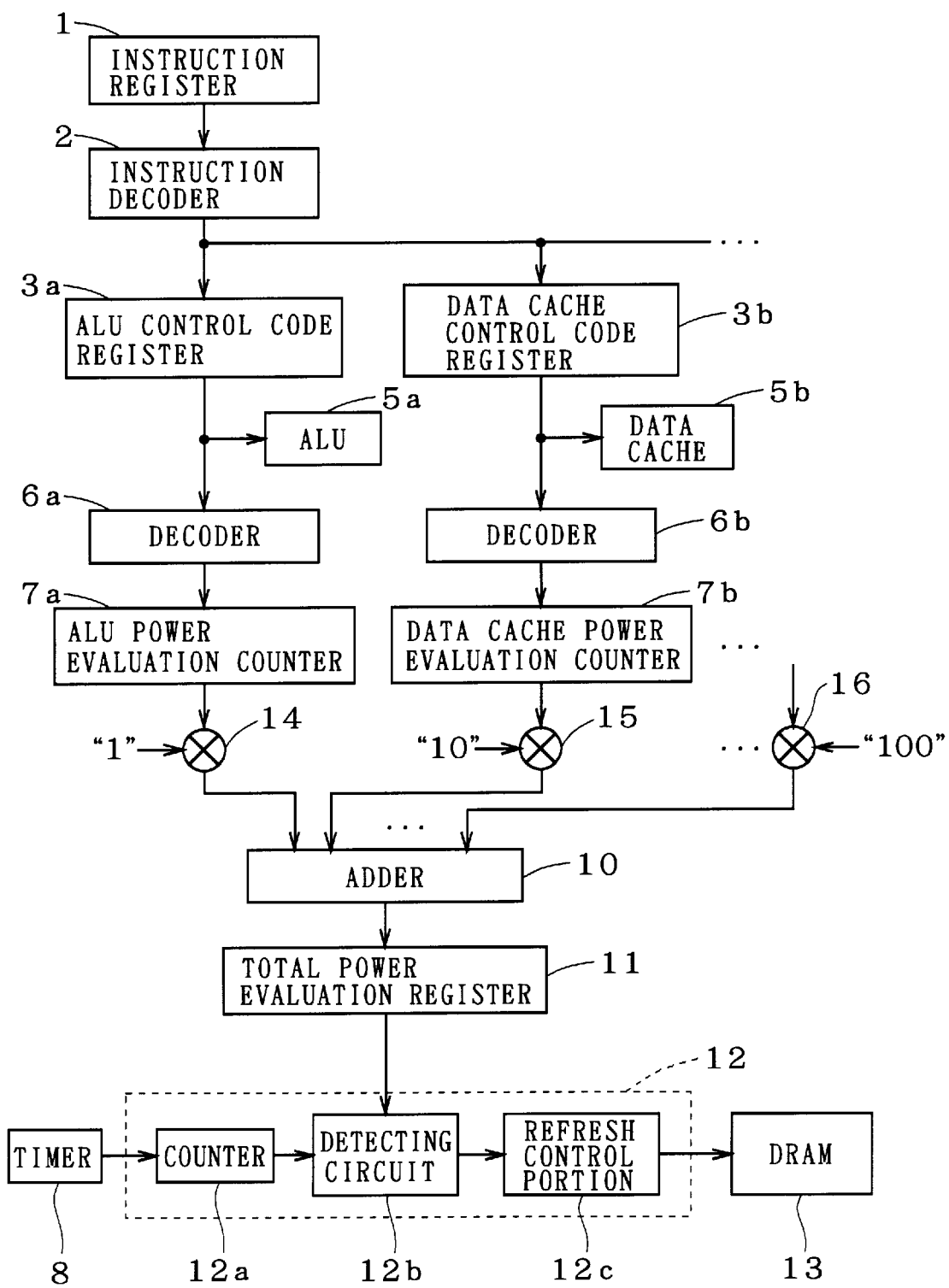
FIG. 1 is a block diagram of a semiconductor device according to a first preferred embodiment of the present invention.

FIG. 1 is a block diagram of a semiconductor device according to a first preferred embodiment of the present invention. An instruction decoder 2 decodes an instruction stored in an instruction register 1 to provide a control code. The control code includes an ALU control code which is a set of signals for operating an ALU 5a, a data cache control code which is a set of signals for operating a data cache 5b, and a set of signals for operating any given circuit other than the ALU 5a and the data cache 5b.

The control code is applied to an ALU control code register 3a, a data cache control code register 3b, and a control code register provided for the given circuit. The ALU 5a, the data cache 5b, and the given circuit operate on the basis of the control code applied thereto to execute an instruction. The ALU 5a does not operate when the control code is the data cache control code. Likewise, the data cache 5b does not operate when the control code is the ALU control code.

A decoder 6a causes an ALU power evaluation counter 7a to count when the control code is not the ALU control code. Specifically, the ALU power evaluation counter 7a counts the number of control codes which do not operate the ALU 5a. Similarly, a decoder 6b causes a data cache power evaluation counter 7b when the control code is not the data cache control code. The counting allows the outputs from the ALU power evaluation counter 7a and data cache power evaluation counter 7b to indicate the respective frequencies with which the associated circuits stop. The ALU power evaluation counter 7a and the data cache power evaluation counter 7b have the function of being automatically reset at constant time intervals and may adopt the amounts of power (i.e. electric energy) estimated from the outputs therefrom as electric power.

The outputs from the ALU power evaluation counter 7a and data cache power evaluation counter 7b are multiplied by predetermined numbers, e.g. "1" and "10" in binary representation as illustrated in FIG. 1, in multipliers 14 and 15, respectively. The results of multiplication are applied to an adder 10. Each of the predetermined numbers corresponds to the amount of power consumed by the associated circuit for each operation. The predetermined numbers shown in FIG. 1 indicate, for example, that the amount of power consumed by the ALU 5a for each operation is one-half the amount of power consumed by the data cache 5b. The amount of power consumed by each of the circuits may be correctly seized by such multiplication. Similar processing is performed in the given circuit. For example, a multiplier 16 multiplies the frequency with which the given circuit stops by "100" in binary representation which indicates that the amount of power consumed by the given circuit for each operation is four times the amount of power consumed by the ALU 5a.

The adder 10 adds the results provided from the multipliers 14 to 16 together to store the result of addition in a total power evaluation register 11. A DRAM refresh control circuit 12 controls the length of the refresh cycle of a DRAM 13 in accordance with the value stored in the total power evaluation register 11. The DRAM 13 may be integrated together with the ALU 5a and the data cache 5b.

As the value stored in the total power evaluation register 11 decreases, the power consumed by the ALU 5a and the data cache 5b increases and, accordingly, the amount of generated heat increases. Then, the refresh cycle is shortened so that the DRAM 13 is refreshed more frequently. From the viewpoint of suppression of power consumption, the semiconductor device may be controlled so that the refresh cycle is prolonged as the value stored in the total power evaluation register 11 decreases. In either case, information about the power consumed by the ALU 5a, the data cache 5b and the like is separately collected. This allows accurate control.

The DRAM refresh control circuit 12 includes a counter 12a which is reset at constant time intervals by a timer 8, a detecting circuit 12b for receiving the output from the counter 12a and the output from the total power evaluation register 11, and a refresh control portion 12c for receiving a command from the detecting circuit 12b to cause the DRAM 13 to be refreshed.

The counter 12a counts up when control is performed so that the refresh cycle is shortened as the value stored in the total power evaluation register 11 decreases. If the value outputted from the counter 12a equals the value outputted from the total power evaluation register 11, the detecting circuit 12b directs the refresh control portion 12c to perform refresh control. That is, as the value stored in the total power evaluation register 11 decreases, the time period over which the value counted up by the counter 12a is equal to the value stored in the total power evaluation register 11 is shortened. Conversely, the counter 12a counts down when control is performed so that the refresh cycle is prolonged as the value stored in the total power evaluation register 11 decreases.

Figure 2:
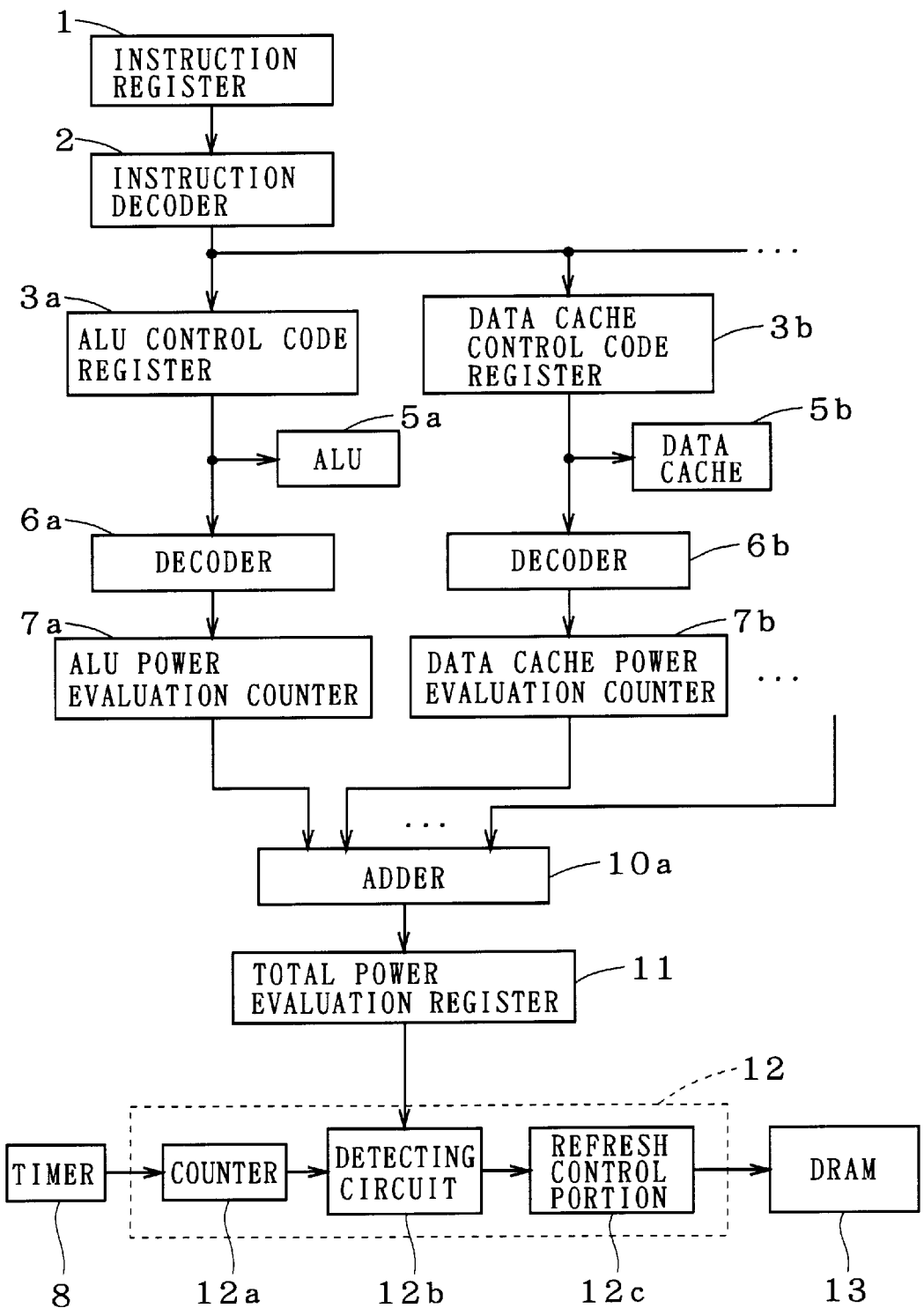
FIG. 2 is a block diagram of a modification of the first preferred embodiment.

FIG. 2 is a block diagram of a modification of the first preferred embodiment. The semiconductor device shown in FIG. 2 differs from the semiconductor device shown in FIG. 1 in that the multipliers 14 to 16 are dispensed with and the adder 10 is replaced with an adder 10a.

The predetermined numbers by which the outputs from the ALU power evaluation counter 7a and data cache power evaluation counter 7b are to be multiplied are set to a given power of 2. Then, the outputs from the ALU power evaluation counter 7a and data cache power evaluation counter 7b may be expressed in binary representation in the adder 10a. Addition of the binary outputs which are shifted into different digit positions achieves substantial multiplication. Thus, the multipliers 14 to 16 may be dispensed with if the adder 10a has the function of shifting the digit position of the augend.

As an alternative to the above described operation, the ALU power evaluation counter 7a and the data cache power evaluation counter 7b may count the number of control codes which operate the ALU 5a and the data cache 5b instead of the number of control codes which do not operate the ALU 5a and the data cache 5b. In this case, the control of the DRAM refresh control circuit 12 should be reversed.

Second Preferred Embodiment

Figure 3:
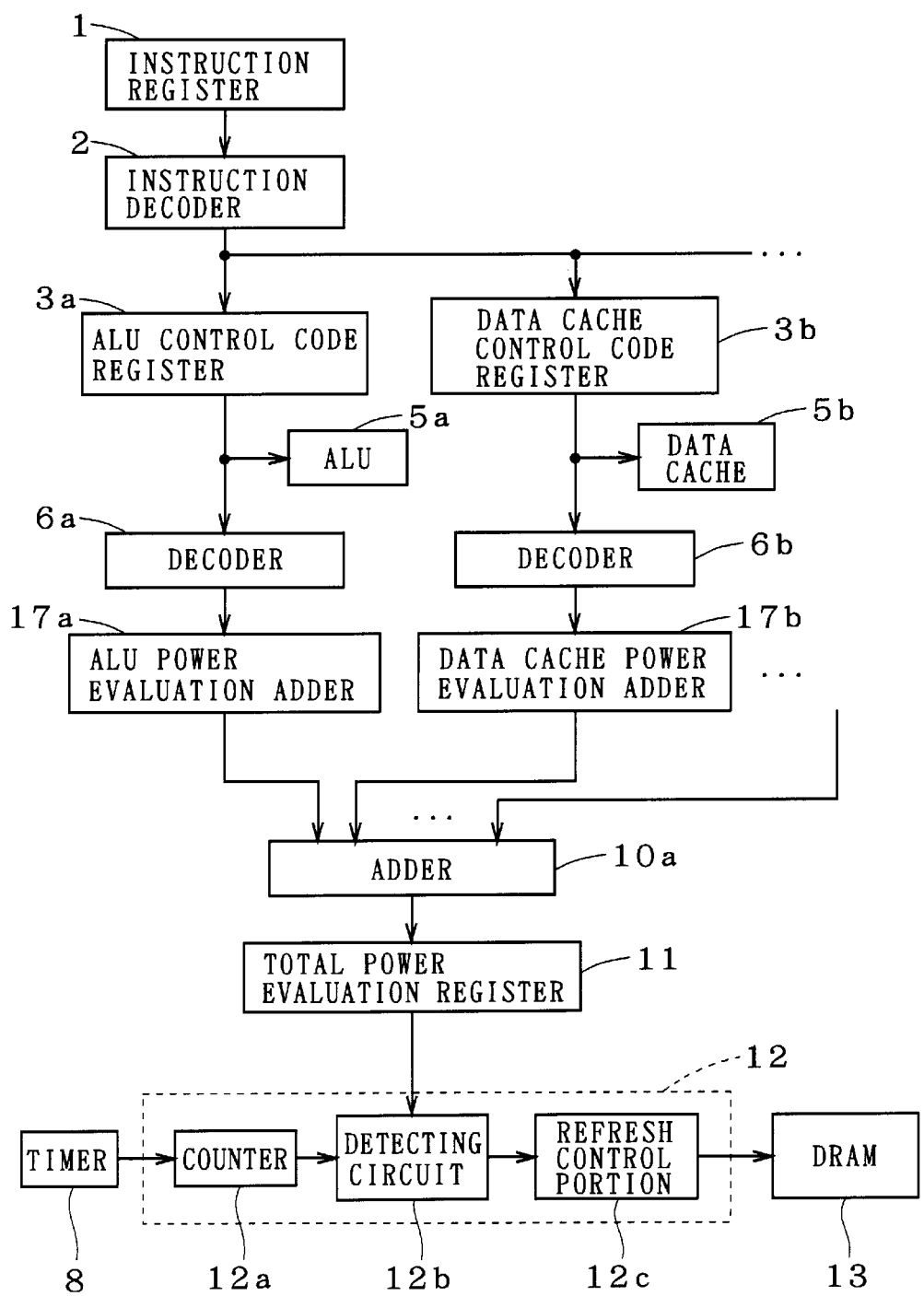
FIG. 3 is a block diagram of the semiconductor device according to a second preferred embodiment of the present invention.

FIG. 3 is a block diagram of the semiconductor device according to a second preferred embodiment of the present invention. The semiconductor device shown in FIG. 3 differs from the semiconductor device shown in FIG. 1 in that the multipliers 14 to 16 are dispensed with, and in that the ALU power evaluation counter 7a and the data cache power evaluation counter 7b are replaced with an ALU power evaluation adder 17a and a data cache power evaluation adder 17b, respectively.

The predetermined numbers are added up respectively in the ALU power evaluation adder 17a and data cache power evaluation adder 17b each time a count command is outputted from the decoders 6a and 6b, instead of being multiplied by the outputs from the ALU power evaluation counter 7a and data cache power evaluation counter 7b. Then, the outputs from the ALU power evaluation adder 17a and data cache power evaluation adder 17b function as the outputs from the multipliers 14 to 16 of the first preferred embodiment. This permits the multipliers 14 to 16 to be dispensed with.

Third Preferred Embodiment

Figure 4:
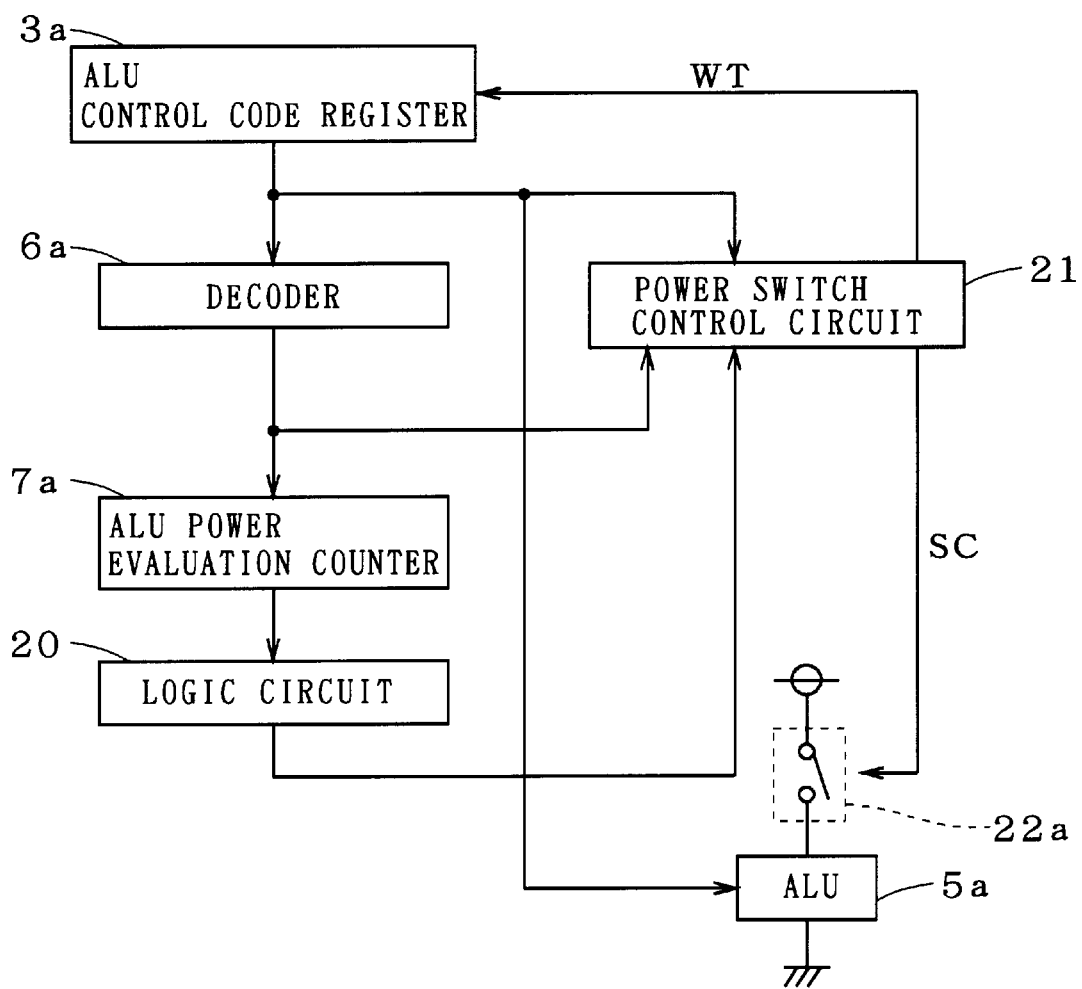
FIG. 4 is a block diagram of the semiconductor device according to a third preferred embodiment of the present invention.

FIG. 4 is a block diagram of the semiconductor device according to a third preferred embodiment of the present invention. The portions which provide inputs to the ALU control code register 3a are not illustrated in FIG. 4 since the ALU control code register 3a of the third preferred embodiment operates the ALU 5a in a manner similar to the ALU control code register 3a of the first preferred embodiment.

The output from the ALU control code register 3a is applied to the decoder 6a which in turn detects the control codes which do not operate the ALU 5a in a manner similar to the decoder 6a of the first preferred embodiment.

The output from the decoder 6a is applied to the ALU power evaluation counter 7a. The ALU power evaluation counter 7a, which is similar in operation to that of the first preferred embodiment, performs the counting operation, for example, counts up when the control code is not that operating the ALU 5a. Unlike the ALU power evaluation counter 7a of the first preferred embodiment, the ALU power evaluation counter 7a of the third preferred embodiment applies an output to a logic circuit 20. The logic circuit 20 detects whether or not the value in the ALU power evaluation counter 7a has reached a predetermined value (referred to hereinafter as a "stop value").

The output from the decoder 6a and the output from the logic circuit 20 are applied to a power switch control circuit 21 which in turn outputs a wait instruction WT and a switch control signal SC on the basis of the values of the outputs.

The switch control signal SC controls the conducting/nonconducting state of a switch 22a. The switch 22a is inserted into a power supply path for the ALU 5a. The conducting/nonconducting state of the switch 22a causes the supply/interrupt of power to the ALU 5a.

Figure 5:
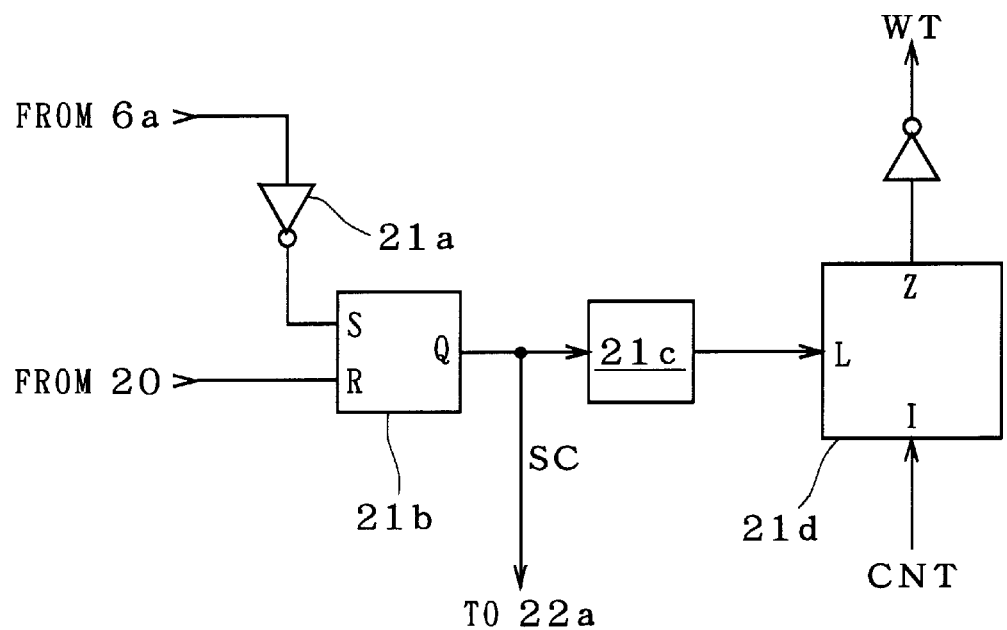
FIG. 5 is a circuit diagram of a power switch control circuit 21.

FIG. 5 is a circuit diagram of the power switch control circuit 21. An inverter 21a receives and inverts the output from the decoder 6a to apply the inverted output to the set end S of a reset-set flip-flop 21b. The output from the logic circuit 20 is applied to the reset end R of the reset-set flip-flop 21b. Specifically, the inverter 21a is set when the control code is that operating the ALU 5a, and is reset when the number of control codes which do not operate the ALU 5a reaches a count corresponding to the stop value.

The reset-set flip-flop 21b is set/reset in this manner. Then, the switch control signal SC from the output Q of the reset-set flip-flop 21b is used to perform control in such a manner that the switch 22a is brought out of conduction to stop supplying power to the ALU 5a when the number of control codes which do not operate the ALU 5a reaches the predetermined count, and that the switch 22a is brought into conduction to supply power to the ALU 5a when the control code which operates the ALU 5a appears.

Such control may stop the power supply on the assumption that the ALU 5a is not frequently used later when the frequency of the use of the ALU 5a is low, to thereby cut off a leakage current flowing steadily in the ALU 5a, suppressing power consumption.

The switch 22a may be specifically implemented by using a transistor. It is desirable to use a substantially large-sized (great channel width) transistor since the entire ALU 5a must be energized. The greater the transistor size, the longer the time required to bring the transistor into and out of conduction. If the switch 22a starts conducting, sufficient power is not supplied to the ALU 5a during transition. It is therefore not desirable to apply the next ALU control code to the ALU 5a during the transition, which might result in malfunctions.

It is hence desirable to use the wait instruction WT to place into the wait state the writing of the ALU control code into the ALU control code register 3a. The wait instruction WT is active during the transition after the switch control signal SC starts causing the switch 22a to conduct. This wait state of the operation of the ALU 5a decreases the performance. However, the decrease in performance takes place in small amounts since the ALU 5a used less frequently so that the stop value is reached is used on rare occasion.

For generation of the wait instruction WT, the power switch control circuit 21 further comprises a one-shot pulse generator 21c for receiving the switch control signal SC, and a counter 21d for receiving the output from the one-shot pulse generator 21c and a fixed value CNT corresponding to a waiting time.

The one-shot pulse generator 21c generates one pulse having a suitable width in response to the rising edge of the switch control signal SC to apply the one pulse to the load end L of the counter 21d. Once the pulse is applied to the load end L of the counter 21d, the counter 21d counts down in a free-running manner until a predetermined value, e.g. "0", is reached from the fixed value CNT at its input end I. When the count reaches "0", the counter 21d activates the wait instruction WT which is outputted at its output end Z. In this manner, the wait instruction WT having the above described characteristics is generated.

Fourth Preferred Embodiment

The supply/interrupt of power to the ALU 5a is described in the third preferred embodiment. However, the power supply/interrupt may be performed on the data cache 5b. In the application of the above described technique to the data cache 5b, it is not desirable to completely stop supplying power to the data cache 5b since the data cache 5b includes a memory cell which must be always energized.

Figure 6:
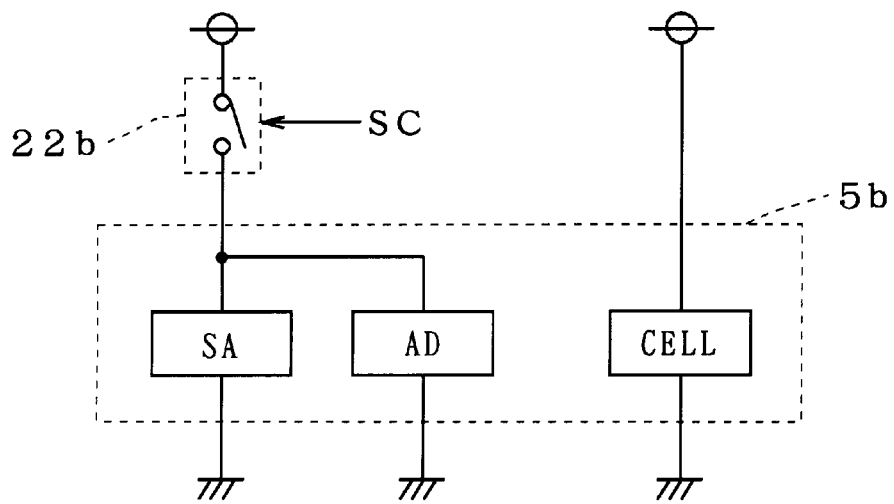
FIG. 6 is a circuit diagram according to a fourth preferred embodiment of the present invention.

FIG. 6 is a circuit diagram of a fourth preferred embodiment of the present invention. A memory cell CELL is not provided with a switch for power supply/interrupt, but a common switch 22b for power supply/interrupt is provided for a sense amplifier SA and an address decoder AD. In this manner, the switch 22b is provided for only the portions which permit the power supply to stop, suppressing power consumed by the data cache 5b while avoiding malfunctions.

While the invention has been described in detail, the foregoing description is in all aspects illustrative and not restrictive. It is understood that numerous other modifications and variations can be devised without departing from the scope of the invention.

I claim:

1. A semiconductor device comprising:
    a plurality of first circuits;
    a plurality of individual power evaluation portions, each of which corresponds to one of said plurality of first circuits, for individually estimating the amounts of power consumed by each corresponding one of said plurality of first circuits;
    a total power evaluation portion for determining the sum of the amounts of estimated power consumed by all of said plurality of first circuits on the basis of a result from said plurality of individual power evaluation portions; and
    a first control portion for controlling the operation of a second circuit on the basis of a result from said total power evaluation portion, said second circuit differing from said plurality of first circuits,
    wherein each of said plurality of individual power evaluation portions comprises first counters provided in corresponding relation to said plurality of first circuits for counting on the basis of whether or not a corresponding one of said plurality of first circuits operates, and
    wherein said first control portion comprises:
        a second counter, said second counter being reset at fixed time intervals;
        a detecting circuit for detecting a coincidence between an output from said second counter and the result from said total power evaluation portion; and
        a second control portion for controlling the operation of said second circuit in accordance with a result from said detecting circuit.

2. A semiconductor device comprising:
    a plurality of first circuits;
    a plurality of individual power evaluation portions each of which corresponds to one of said plurality of first circuits, for individually estimating the amounts of power consumed by each corresponding one of said plurality of first circuits;
    a total power evaluation portion for determining the sum of the amounts of estimated power consumed by all of said plurality of first circuits on the basis of a result from said plurality of individual power evaluation portions;
    a power switch provided in corresponding relation to one of said plurality of first circuits for controlling power to be supplied to said one circuit on the basis of the result from said plurality of individual power evaluation portions; and
    a power switch control portion for controlling a conducting/nonconducting state of said power switch to output a wait instruction, said wait instruction being active for a predetermined period of time after said power switch is brought into conduction,
    wherein said power switch control portion comprises a flip-flop, said flip-flop being reset when a predetermined count of control codes which do not operate said one circuit is reached, said flip-flop being set when a control code which operates said one circuit appears, said flip-flop providing an output for controlling the conducting/nonconducting state of said power switch, and
    wherein said power switch control portion further comprises:
        a one-shot pulse generating circuit responsive to the output from said flip-flop; and
        a counter for counting in response to an output from said one-shot pulse generating circuit, said counter outputting said wait instruction when a predetermined value is reached.

* * * * *